United States Patent
Drapkin et al.

[11] Patent Number: 6,160,430
[45] Date of Patent: Dec. 12, 2000

[54] POWERUP SEQUENCE ARTIFICIAL VOLTAGE SUPPLY CIRCUIT

[75] Inventors: Oleg Drapkin, North York; Grigori Temkine, Toronto, both of Canada

[73] Assignee: ATI International SRL, Barbados, St. Kitts/Nevis

[21] Appl. No.: 09/274,456

[22] Filed: Mar. 22, 1999

[51] Int. Cl.[7] .................................................. H03L 7/00
[52] U.S. Cl. ............................................. 327/143; 327/77
[58] Field of Search .......................... 307/43, 44; 326/80, 326/81; 327/63, 68, 69, 70, 72, 77, 80, 81, 82, 143, 198, 403, 404, 405

[56] References Cited

U.S. PATENT DOCUMENTS

| | | | |
|---|---|---|---|
| 4,617,473 | 10/1986 | Bingham | 307/66 |
| 5,157,291 | 10/1992 | Shimoda | 307/573 |
| 5,426,386 | 6/1995 | Matthews et al. | 327/63 |
| 5,457,414 | 10/1995 | Inglis et al. | 327/77 |
| 5,510,735 | 4/1996 | Mahabadi | 327/77 |
| 5,783,964 | 7/1998 | Eitan | 327/408 |

*Primary Examiner*—Jeffrey Zweizig
*Attorney, Agent, or Firm*—Markison & Reckamp, P.C.

[57] ABSTRACT

A powerup sequencing circuit and method generates an artificial supply voltage until the actual supply voltage is at a suitable level. An artificial supply source, such as a pull up circuit, is coupled to a node that receives a first supply voltage, such as an I/O buffer voltage. The pull up circuit is also coupled to an isolatable source voltage node. The isolatable source voltage node is the node that causes the actual second supply voltage. A temporary isolation circuit is operatively coupled to the pull up circuit and is operatively interposed between the node that receives the first supply voltage and the isolatable source voltage node. The pull up circuit provides a temporary or artificial second supply voltage level to an on chip circuit, such as an I/O buffer circuit or other suitable circuit that may, for example, be multi-voltage supply dependent. The temporary supply voltage is provided to the on chip circuit during powerup and the temporary isolation circuit operatively isolates the isolatable source voltage node until the second supply voltage reaches a suitable level and turns off the temporary isolation circuit.

24 Claims, 3 Drawing Sheets ions. The single gate oxide
POWERUP SEQUENCE ARTIFICIAL VOLTAGE SUPPLY CIRCUIT

FIELD OF THE INVENTION

The invention relates generally to powerup sequencing circuits and more particularly to powerup sequencing circuits configured on integrated circuits.

BACKGROUND OF THE INVENTION

There is a growing demand for integrated circuits that can operate at different voltage supplies while also allowing different levels of input signals to be received by such circuits. For example, with computer graphics subsystems and other integrated circuits, core logic may be designed to operate at different voltage supply levels, such as 2.5 V or 1.8 V. Such chip cores or other circuits may be coupled to on chip input/output circuits such as input/output buffers which are connected to input/output pads or pins. These input/output pads or pins may then be connected to peripheral circuitry which may operate at several different input signal levels such as 1.5 V, 2.5 V or 3.3 V. With the increased demand for additional operational functions and integrated circuits, it is desirable to also increase operating frequency of such devices and decrease fabrication costs. As such, single gate oxide transistors have been proposed to be used on these integrated circuits. For example, a single 0.18 micrometer gate oxide length may be used for circuits that have a supply voltage of 1.8 V. The single gate oxide devices, may be, for example, CMOS transistors.

Because the core circuitry and I/O circuitry must interface with logic signals from other peripheral circuits that may have different input voltages or supply voltages, I/O circuit configurations may be structured to withstand 3.3 V or 2.5 V I/O voltage supplies despite normal 1.8 V based core logic circuits. Because the I/O buffers may require different multiple level supplies such as 3.3 V or 2.5 V voltage supply levels to interface with other circuits, a number of different input/output buffer circuits may be designed on a chip, so that depending upon the input signal level or I/O supply voltage level, one buffer configuration is activated over another. However, a problem arises during the powerup sequence if the core logic voltage, for example, is 1.8 V and if the I/O pad voltage supply is at a higher 3.3 V or 2.5 V level. Damage can occur to 30 Å gate oxide thickness and 0.18 micrometer gate length devices due to potential overvoltage conditions if the I/O pad voltage supply appears first. This may occur because the correct I/O buffer circuitry has not been properly selected. For example, if the I/O pad voltage is powered up before the core supply voltage, the core supply voltage, if it were used to select a suitable I/O buffer circuitry, may not select a proper circuit and the higher I/O supply voltage may be inadvertently applied to 0.18 micrometer gate length I/O circuitry. Therefore, if the I/O pad voltage supply appears first, the 30 Å gate oxide thicknesses and 0.18 micrometer, and 1.8 V CMOS transistors could be damaged.

Prior powerup sequence solutions have involved a printed circuit board level usage of voltage regulators that provide delay for I/O pad supply voltages as compared to the reference for the core voltage supply. With these circuits, the voltage regulator on a printed circuit board powers up the core voltage supply first and only alter that the I/O pad voltage supply is powered up. However, this solution typically means additional printed circuit board costs which can greatly reduce the competitive advantage of the increased functionality of the integrated circuits.

In addition, powerup sequencing circuits, if configurable on an integrated circuit, should not unnecessarily draw current during normal operating modes and should not decrease the electrostatic discharge protection capability of the integrated circuit or its chip.

Consequently, a need exists for a powerup sequencing circuit that may be configured on an integrated circuit that does not unnecessarily consume DC current during normal operating modes and does not decrease electrostatic discharge protection of a chip.

DETAILED DESCRIPTION OF A PREFERRED EMBODIMENT OF THE INVENTION

Briefly, a powerup sequencing circuit and method generates an artificial supply voltage until the actual supply voltage is at a suitable level. An artificial supply source, such as a pull up circuit, is coupled to a node that receives a first supply voltage, such as an I/O buffer voltage. The pull up circuit is also coupled to an isolatable source voltage node. The isolatable source voltage node is the node that causes the actual second supply voltage. A temporary isolation circuit is operatively coupled to the pull up circuit and is operatively interposed between the node that receives the first supply voltage and the isolatable source voltage node. The pull up circuit provides a temporary or artificial second supply voltage level to an on chip circuit, such as an I/O buffer circuit or other suitable circuit that may, for example, be multi-voltage supply dependent. The temporary supply voltage is provided to the on chip circuit during powerup and the temporary isolation circuit operatively isolates the isolatable source voltage node until the second supply voltage reaches a suitable level and turns off the temporary isolation circuit.

The pull up circuit is effectively deactivated during normal operation so as not to draw excessive DC current. In addition, the multi-supply dependent logic or other on chip circuit does not receive inappropriate voltage levels so that lower voltage level based circuitry is not unnecessarily damaged during power up condition.

Figure 1:
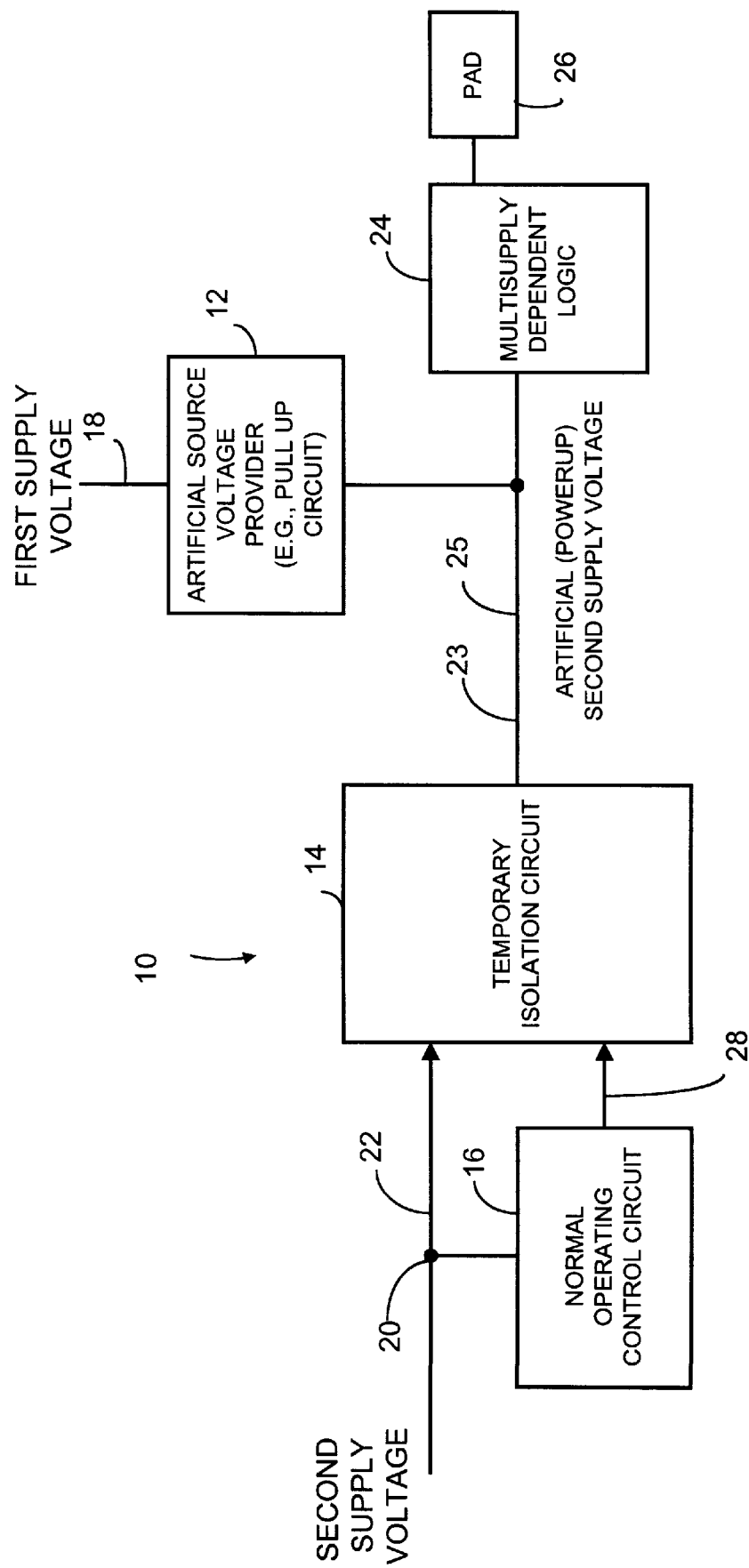
FIG. 1 is a block diagram illustrating an example of a powerup sequencing circuit in accordance with one embodiment of the invention.

FIG. 1 shows one example of a powerup sequencing circuit 10 having a pull up circuit 12, a temporary isolation circuit 14 and a normal operating control circuit 16. The pull up circuit is a form of an artificial voltage source. The pull up circuit 12 is operatively coupled to a node 18 that receives a first supply voltage 19 that may be, for example, a higher supply voltage than a second supply voltage 20 received at an isolatable source voltage node 20. The first supply voltage 19 may be, for example, a 2.5 V, 3.3 V or other suitable voltage level, for example, for powering an I/O pad or I/O buffer circuitry. During normal operation, the isolatable source voltage node 22 receives the second supply voltage 20 which may be a lower voltage such as 1.8 V which may be, for example, a core logic supply voltage. The pull up circuit 12 is also operatively coupled to the temporary isolation circuit 14 and provides an artificial second supply voltage 23 to multi-supply dependent logic 24. The multi-supply dependent logic 24 may be, for example, any suitable plurality of different I/O buffer circuits that may be selectively switched on or off depending upon the voltage level or the first supply voltage. One example of a multi-supply dependent logic may be found in co-pending application entitled "Prebuffer Voltage level Shifting Circuit and Method" having Ser. No. 09/214,496, filed on Dec. 14, 1998 and owned by instant Assignee. The multi-supply dependent logic may be input/output buffer logic as noted, which may be then operatively couple to a pad or pin 26 which may then interface with peripheral circuitry. During powerup, the pull up circuit 12 temporarily generates the artificial second supply voltage. Also, the powerup sequence circuit 10 of FIG. 1 is configured on the same integrated circuit chip as the on chip circuit 24.

The temporary isolation circuit 14 receives the artificial second supply voltage from the pull up circuit 12 during powerup and also effectively provides the second supply voltage to the multi-supply dependent logic 24 during normal operation. The temporary isolation circuit 14 is interposed between the node that receives the first supply voltage 18 and the isolatable source voltage node 22.

The pull up circuit 12 provides a temporary supply voltage 23 to the on chip multi-supply dependent logic 24, or other suitable circuit, during powerup. The multi-supply dependent logic 24 is an on chip circuit that includes a plurality of circuits that are selectable based on a level of the first supply voltage. The temporary isolation circuit 14 operatively isolates the isolatable source voltage 20, until the second supply voltage 20 turns off the temporary isolation circuit 14. In this example, the first supply voltage 18 is higher than the second supply voltage 20. The temporary isolation circuit 14 receives the second supply voltage 20 as well as a normal operating condition control signal 28. The normal operating condition control signal 28 is generated during normal operation to allow the temporary isolation circuit to pass the second voltage to the supply dependent logic 24.

Figure 2:
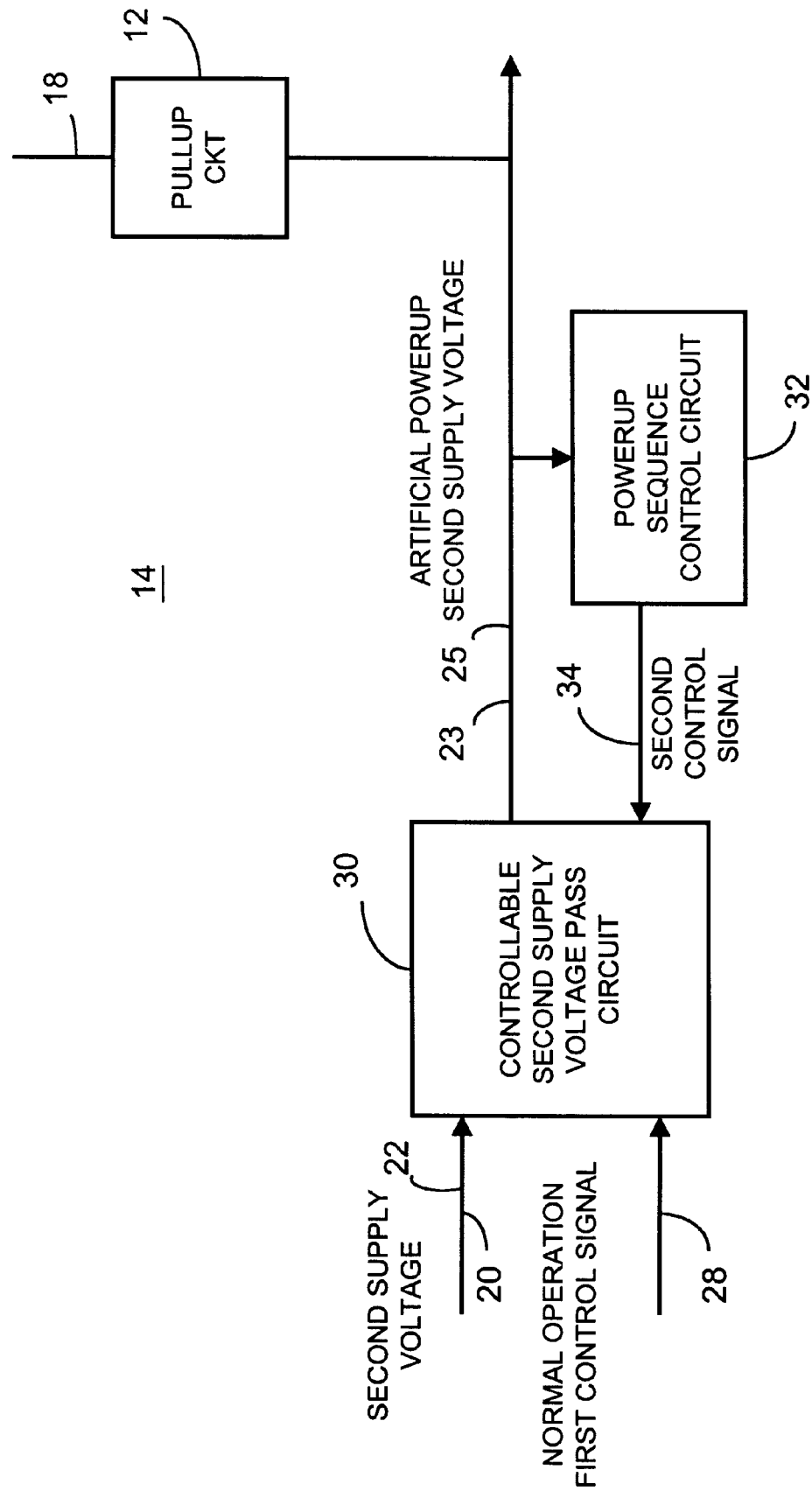
FIG. 2 is a block diagram of an example of a temporary isolation circuit in accordance with one embodiment of the invention.

FIG. 2 shows a block diagram of an example of the temporary isolation circuit 14 having a controllable second supply voltage pass circuit 30 and a powerup sequence control circuit 32. The controllable second supply voltage pass circuit 30 passes the second supply voltage 20 to the on chip circuit 24 during non-isolation conditions. The powerup sequence control circuit 32 generates a powerup sequence control signal 34 to control the controllable second supply voltage pass circuit 30 to isolate the second supply voltage 20 when the pull up circuit 12 is active.

In operation, if the first supply voltage reaches a suitable level before the second supply voltage, the pull up circuit provides the artificial powerup second supply voltage 23 to the multi-supply dependent logic. The powerup sequence control circuit 32 senses the level of the artificial powerup second supply voltage 23 and provides a second control signal 34 to the controllable second supply voltage pass circuit 30. The second control signal 34 keeps the controllable second supply voltage pass circuit 30 in an isolation mode to isolate the second supply voltage 20 until the second supply voltage 20 reaches the artificial supply voltage 23. The normal operation control signal 28 is generated when the second supply voltage reaches this suitable level. The normal operation control signal 28 then activates the controllable supply voltage pass circuit 30 to pass the second supply voltage 20 to the multi-supply dependent logic 24 via node 25. As such, the node 25 will provide both the artificial powerup second supply voltage 23 and the passed second supply voltage. For example, the artificial powerup second supply voltage 23 is provided during the powerup condition whereas the second supply voltage is provided (passed) during normal operation when the second supply voltage has reached a suitable level. The controllable second supply voltage pass circuit 30 serves in conjunction with a powerup sequence control circuit 32 to isolate the second supply voltage node and corresponding circuitry from overvoltage conditions.

Figure 3:
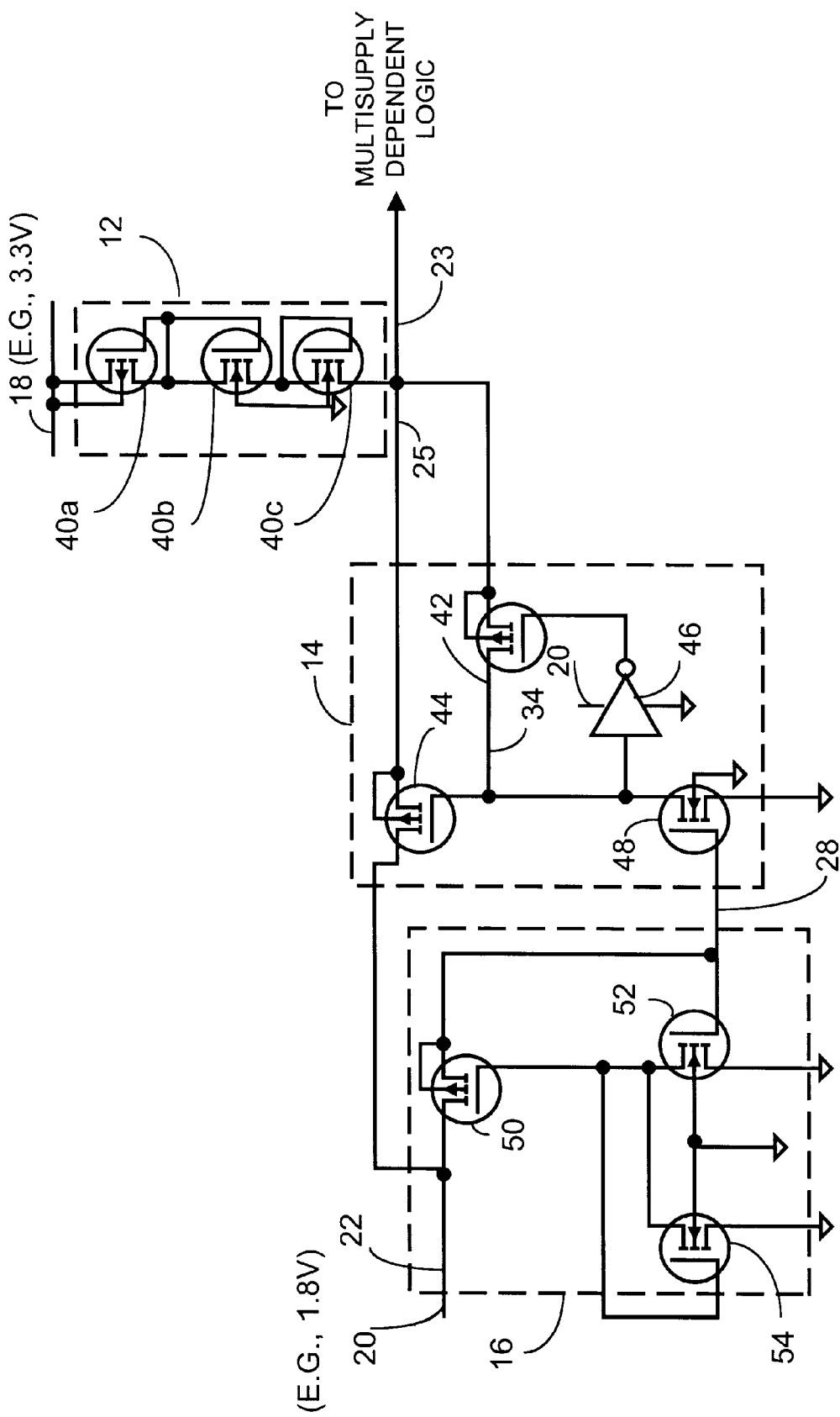
FIG. 3 is a circuit diagram illustrating one example of a powerup sequencing circuit in accordance with one embodiment of the invention.

FIG. 3 shows one example of a circuit for implementing the powerup sequence circuit 10. In this example, the pull up circuit 12 includes a rectifier element, such as a plurality of series connected MOS diodes 40a, 40b and 40c. This embodiment of the rectifier element allows the pull up circuit 12 to effectively pull up the artificial powerup supply voltage node 25 to a suitable level (such as the second supply voltage level) to provide a non-damaging level to the multi-supply dependent logic 24 so that lower voltage level circuits (e.g., 1.8 V based circuits) of the multi-supply dependent logic 24 may not be damaged and may allow suitable selection of the appropriate I/O circuitry. The pull up circuit 12 in this embodiment is a unidirectional circuit in that, when the second supply voltage 20 reaches a suitable level, becomes inactive during normal operation. As such, little power consumption occurs by implementation of this arrangement. In this particular embodiment, although not necessary, MOS diode 40a is a PMOS transistor configured as a MOS diode. Diode 40b is an NMOS transistor configured as a MOS diode and diode 40c is another NMOS transistor configured as a MOS diode.

The temporary isolation circuit 14 includes an isolation control transistor 42, such as a pmos transistor, that is operatively coupled to the pull up circuit 12 and to an input of a controllable supply voltage pass transistor 44, such as a pmos transistor. The isolation control transistor 42 is operative to turn off the controllable supply voltage pass transistor 44 when the pull up circuit 12 is active. The temporary isolation circuit 14 also includes an inverter 46 having an output operatively coupled to an input of the isolation control transistor 42 and an input operatively coupled to an input of the controllable supply voltage transistor 44. The inverter 46 is operative to deactivate the isolation control transistor 42 when the second supply voltage 20 reaches a suitable level. The temporary isolation circuit 14 also includes a normal operation drive transistor 48 operatively coupled to an input of the inverter and to the input of the controllable supply voltage pass transistor 44. The normal operation drive transistor 48 is operative to activate the controllable supply voltage pass transistor 44 to pass the second supply voltage 20 to the on chip circuit 24 when the second supply voltage reaches a suitable level. As shown, the inputs of the transistors may include, for example, the gates of the transistors.

The normal operation control circuit 16 includes a voltage pass transistor 50 having an input operatively coupled to an output (e.g., drain) of a noise reduction transistor 52. The noise reduction transistor 52 has input that is operatively coupled to a source of the voltage pass transistor 50. The input of the pass transistor 50 is also coupled to an output, such as a drain, of another transistor 54 that may be configured as a diode. Hence, the transistor 54 has an input operatively coupled to the drain of the transistor 54 and the input of the voltage pass transistor 50.

In operation, during powerup, the diode based pull up circuit 12 pulls up node 25 (assuming second supply voltage 20 has not reached its suitable level) to a diode drop in this case of equal to three diode voltage threshold drops. For example, if the second supply voltage is 3.3 V, and the diode voltage threshold drop is approximately 0.6 V, the artificial second supply voltage 23 will be equal to 3.3 V minus 1.8 V, which is equal to approximately 1.5 V. The transistor 42 effectively keeps the voltage pass transistor 44 in an off state to isolate the multi-supply dependent logic 24 and the second supply voltage 20 until the second supply voltage reaches a suitable level. Because the second supply voltage is left on, the transistor 48 is effectively off.

During normal operation, the second supply voltage which may reach, for example, 1.8 V, will turn on transistor 48 thereby turning on transistor 44 to pass the supply voltage 20 to the artificial supply voltage node 25. Also, during normal operation, the inverter 46 effectively shuts off transistor 42 to prevent the pass transistor 44 from operating as a diode.

The normal operating control circuit 16 uses transistor 54 to turn on the pass transistor 50 to provide a soft second supply voltage to transistor 48 to keep the transistor 48 on during normal operation. Transistor 52 provides additional noise reduction since it pulls the gate of transistor 50 low, when there may be noise on the second supply voltage line. The capacitance of the transistors 54 and 52 become more stable, thereby providing improved noise protection.

As such, the aforedescribed circuit and methods effectively provide an artificial supply voltage to the multi-dependent logic circuit 24 so that the multi-supply dependent logic circuit 24 does not get damaged and may suitably select the appropriate buffer or I/O circuitry needed to communicate at the first supply voltage level. As such, during powerup, damage does not occur to the output stage or the multi-supply dependent logic due to improper sequencing of supply voltage levels. Since the aforedescribed circuit may be incorporated on a single integrated circuit with the multi-supply dependent logic, ease of fabrication and lowering of costs may occur. In addition, the pull up circuit that provides the artificial second supply voltage is effectively disabled during normal operation thereby reducing power consumption during normal operation.

It should be understood that the implementation of other variations and modifications of the invention in its various aspects will be apparent to those of ordinary skill in the art, and that the invention is not limited by the specific embodiments described. For example, the embodiment of FIG. 3 is just one of many ways to implement the invention. Also, although the devices in FIG. 3 may be single gate oxide devices, multi-gate oxide devices or other devices may also be used. It is therefore contemplated to cover by the present invention, any and all modifications, variations, or equivalents that fall within the spirit and scope of the basic underlying principles disclosed and claimed herein.

What is claimed is:

1. A power up sequencing circuit comprising:
    a pull up circuit operatively coupled to a node that receives a first power sequenceable supply voltage and to an isolatable source voltage node; and
    a temporary isolation circuit operatively coupled to the pull up circuit and operatively interposed between the node that receives the first power sequenceable supply voltage and the isolatable source voltage node wherein the pull up circuit provides a temporary supply voltage to an on-chip circuit during power up and the temporary isolation circuit operatively isolates the isolatable source voltage node until a second power sequenceable supply voltage turns off the temporary isolation circuit wherein the first power sequenceable supply voltage is higher than the second power sequenceable power supply voltage.

2. The circuit of claim 1 wherein the pull up circuit is comprised of at least one rectifier element.

3. The circuit of claim 1 wherein the pull up circuit is comprised of a plurality of series connected diodes.

4. The circuit of claim 1 wherein the pull up circuit is operative to shut off during normal operation.

5. The circuit of claim 1 wherein the temporary isolation circuit includes a controllable second supply voltage pass circuit operative tc, pass the second power sequenceable supply voltage to the on chip circuit during non-isolation conditions.

6. The circuit of claim 5 wherein the controllable second supply voltage pass circuit includes a controllable supply voltage pass transistor operatively coupled to the second power sequenceable supply voltage, the pull up circuit and the on chip circuit.

7. The circuit of claim 5 including a power up sequence control circuit that generates a first control signal operative to control the controllable second supply voltage pass circuit to isolate the second power sequenceable supply voltage when the pull up circuit is active.

8. The circuit of claim 7 including a normal operation control circuit that generates a second control signal to the temporary isolation circuit.

9. The circuit of claim 6 wherein the temporary isolation circuit includes an isolation control transistor, operatively coupled to the pull up circuit and to an input of the controllable supply voltage pass transistor, operative to turn off the controllable supply voltage pass transistor when the pull up circuit is active.

10. The circuit of claim 9 wherein the temporary isolation circuit also includes:
    an inverter having an output operatively coupled to an input of the isolation control transistor, operative to deactivate the isolation control transistor when the second supply voltage reaches a suitable level; and
    a normal operation drive transistor operatively coupled to an input of the inverter and to the input of the controllable supply voltage pass transistor, operative to activate the controllable supply voltage pass transistor to pass the second supply power sequenceable voltage to the on-chip circuit when the second power sequenceable supply voltage reaches a suitable level.

11. The circuit of claim 1 wherein the pull up circuit and the temporary isolation circuit are configured on a same integrated circuit chip as the on-chip circuit and wherein the on-chip circuit includes a plurality of circuits that are selectable based on a level of the first power sequenceable supply voltage.

12. The circuit of claim 11 wherein the plurality of circuits include input/output buffer circuits and wherein the first power sequenceable supply voltage is an input/output ring supply voltage, and wherein the second power sequenceable supply voltage is a supply voltage for core logic in the chip.

13. The circuit of claim 8 wherein the normal operation control circuit includes a first voltage pass transistor having an input operatively coupled to a drain of a second transistor wherein the second transistor has an input operatively coupled to a source of the first voltage pass transistor and wherein the input of the first pass transistor is also operatively coupled to a drain of a third transistor wherein the third transistor has an input operatively coupled to the drain of the third transistor.

14. A power up sequencing circuit comprising:
- a pull up circuit operatively coupled to a node that receives a first power sequenceable supply voltage and to an isolatable source voltage node;
- a temporary isolation circuit operatively coupled to the pull up circuit and operatively interposed between the node that receives the first power sequenceable supply voltage and the isolatable source voltage node wherein the pull up circuit provides a temporary supply voltage to an on-chip circuit during power up and the temporary isolation circuit operatively isolates the isolatable source voltage node until a second power sequenceable supply voltage turns off the temporary isolation circuit wherein the first power sequenceable supply voltage is higher than the second power sequenceable power supply voltage; and
- a normal operation control circuit that generates a control signal to the temporary isolation circuit, wherein the normal operation control circuit includes a first voltage pass transistor having an input operatively coupled to a drain of a second transistor wherein the second transistor has an input operatively coupled to a source of the first voltage pass transistor and wherein the input of the first pass transistor is also operatively coupled to a drain of a third transistor wherein the third transistor has an input operatively coupled to the drain of the third transistor.

15. The circuit of claim 14 wherein the pull up circuit is comprised of at least one rectifier element.

16. The circuit of claim 14 wherein the pull up circuit is comprised of a plurality of series connected diodes.

17. The circuit of claim 14 wherein the pull up circuit is operative to shut off during normal operation.

18. The circuit of claim 14 wherein the temporary isolation circuit includes a controllable second supply voltage pass circuit operative to pass the second supply voltage to the on chip circuit during non-isolation conditions.

19. The circuit of claim 18 wherein the controllable second supply voltage pass circuit includes a controllable supply voltage pass transistor operatively coupled to the second power sequenceable supply voltage, the pull up circuit and the on chip circuit.

20. The circuit of claim 18 including a power up sequence control circuit that generates a first control signal operative to control the controllable second supply voltage pass circuit to isolate the second power sequenceable supply voltage when the pull up circuit is active.

21. The circuit of claim 19 wherein the temporary isolation circuit includes an isolation control transistor, operatively coupled to the pull up circuit and to an input of the controllable supply voltage pass transistor, operative to turn off the controllable supply voltage pass transistor when the pull up circuit is active.

22. The circuit of claim 21 wherein the temporary isolation circuit also includes:
- an inverter having an output operatively coupled to an input of the isolation control transistor, operative to deactivate the isolation control transistor when the second power sequenceable supply voltage reaches a suitable level; and
- a normal operation drive transistor operatively coupled to an input of the inverter and to the input of the controllable supply voltage pass transistor, operative to activate the controllable supply voltage pass transistor to pass the second power sequenceable supply voltage to the on-chip circuit when the second power sequenceable supply voltage reaches a suitable level.

23. The circuit of claim 14 wherein the pull up circuit and the temporary isolation circuit are configured on a same integrated circuit chip as the on-chip circuit and wherein the on-chip circuit includes a plurality of circuits that are selectable based on a level of the first power sequenceable supply voltage.

24. The circuit of claim 23 wherein the plurality of circuits include input/output buffer circuits and wherein the first power sequenceable supply voltage is an input/output ring supply voltage, and wherein the second power sequenceable supply voltage is a supply voltage for core logic in the chip.

* * * * *